United States Patent [19]

Kadomura

[11] Patent Number: 5,326,431
[45] Date of Patent: Jul. 5, 1994

[54] DRY ETCHING METHOD UTILIZING $(SN)_x$ POLYMER MASK

[76] Inventor: Shingo Kadomura, c/o Sony Corporation 7-35, Kitashinagawa 6-chome, Shinagawa-ku, Tokyo, Japan

[21] Appl. No.: 893,059

[22] Filed: Jun. 3, 1992

[30] Foreign Application Priority Data

| Jun. 3, 1991 | [JP] | Japan | 3-157479 |
| Oct. 11, 1991 | [JP] | Japan | 3-290492 |
| Feb. 28, 1992 | [JP] | Japan | 4-043783 |

[51] Int. Cl.⁵ ............................ H01L 21/00
[52] U.S. Cl. .................. 156/659.1; 156/643; 156/646; 156/662; 156/665; 156/661.1; 156/656; 156/657
[58] Field of Search ............... 156/662, 643, 646, 657, 156/656, 655, 659.1, 661.1, 665

[56] References Cited

U.S. PATENT DOCUMENTS

| 4,330,384 | 5/1982 | Okudaira et al. | 204/298.37 |
| 4,579,623 | 4/1986 | Suzuki et al. | 156/626 |
| 4,713,141 | 12/1987 | Tsang . | |
| 4,975,144 | 12/1990 | Yamazaki et al. | |

FOREIGN PATENT DOCUMENTS 0246514 11/1987 European Pat. Off. .

OTHER PUBLICATIONS

"D.C. Plasma Etching of Silicon By Sulfur Hexafluoride. Mass Spectrometric Study of The Discharge Products"; Wagner et al.; 1981; abstract only; Plasma Chem. Proc. 1(2), U.S.A.

Nakamura et al, "Very High Selective n+ poly Si RIE with Carbon Elimination", *Second Microprocess Conference*, 1989, Digest of Papers, pp. 190-191.

Pelletier et al, "$S_2Br_2$, $S_2Cl_2$, $S_2F_2$: A New Line of Halogen-Containing Gases for Low-Pressure Plasma Etching Process", *Japanese Journal of Applied Physics*, vol. 29, No. 9, Sep. 8, 1990, pp. 1846-1853.

*Primary Examiner*—Brian E. Hearn
*Assistant Examiner*—George Goudreau
*Attorney, Agent, or Firm*—Hill, Steadman & Simpson

[57] ABSTRACT

A dry etching method using no organic resist mask without involving an increase in the number of necessary processes or wafer surface steps. Conventionally, a nitrogen based compound film is formed as a thin anti-reflection film on a gate electrode or aluminum (Al) metallization layer. The nitrogen based compound film thus formed can be used as an etching mask for the material layer by using etching gas capable of forming sulfur (S) in a plasma when dissociated by electric discharges. For instance, a W polycide film masked by a TiON anti-reflection film patterned into a predetermined shape can be etched by $S_2F_2/H_2$ mixed gas. In this case, a nitrogen (N) dangling bond formed on the surface of the TiON anti-reflection film combines with sulfur supplied by $S_2F_2$ to form a polythiazyl $(SN)_x$ coating, which provides the resulting TiON anti-reflection film pattern with a sufficient etching resistance to act as an etching mask. This etching process emits no carbon to the etching system, thus improving selectivity for a $SiO_2$ based material layer. The TiON anti-reflection film pattern can also be used as an etching mask for an aluminum metallization layer with a view to reducing after-corrosion.

21 Claims, 4 Drawing Sheets

DRY ETCHING METHOD UTILIZING (SN)$_x$ POLYMER MASK

BACKGROUND OF THE INVENTION

1. Field of the Invention

The present invention relates to a dry etching method employed in such applications as production of semiconductor devices. More particularly, it relates to a dry etching method whereby a nitrogen based compound film can be substituted for a resist mask as an etching mask, thereby preventing promotion of carbon pollution and deterioration of selectivity for an underlying layer and inhibiting after-corrosion.

2. Description of the Related Art

The recent trend toward higher integration and performance of such semiconductor devices as VLSIs and ULSIs requires a dry etching method whereby correspondingly higher anisotropy, higher etchrate, higher selectivity, lower pollution, and less damage can be achieved with no compromise in these requirements.

Most typical of the conventional dry etching methods is to etch a target material layer via a resist mask patterned into a predetermined shape. In this method, etching the target material layer into an isotropic shape requires applying a high bias power thereto under low gas pressure to increase the mean free path of ions and the energy of incident ions. At this time, high-energy incident ions will sputter the resist mask, composed of organic materials, and form a carbonaceous decomposition product, which will, in turn, deposit on pattern sidewalls as a carbonaceous polymer, providing sidewall protection effects and contributing to isotropic etching.

In recent years, however, it has been revealed that carbon present in the etching system causes various problems.

One of the problems is a deterioration of the selectivity for silicon oxide (SiO$_2$) in the presence of carbon. This phenomenon is reported in the Extended Abstract of the 36th Spring Meeting (1989) of the Japan Society for Applied Physics and Related Societies, Vol. 2, p. 572, 1p-L-7 and January's issue of Monthly Magazine "Semiconductor World" (published by Press Journal Inc.) (1990), p. 81-84. The cause of this phenomenon is that an SiO$_2$ gate oxide film, which would not be etched in theory, is etched slightly when a gate electrode formed thereon is etched by using HBr gas. This cause is somewhat predictable from the descending order in binding energy of an Si—O bond (111 kcal/mole), Si—Br bond (88 kcal/mole), and Si—Si bond (54 kcal/mole). As a result, when an Si based material layer formed on an SiO$_2$ based material layer is etched by using HBr gas, high selectivity can be expected for the underlying layer, but its actual value is in the order of 10 to 20.

According to the above mentioned sources, such low selectivity for the SiO$_2$ based material layer can be attributed to carbon pollution. More specifically, any carbon adsorbing on the surface of the SiO$_2$ based material layer will form a C—O bond (257 kcal/mole), which will override an Si—O bond with a smaller binding energy and form an Si—Br bond with an even smaller binding energy. To improve the selectivity for the SiO$_2$ based material layer, the above-mentioned Extended Abstract proposes the measure of using HBr gas with higher purity, an etching chamber and pipes of pollution-free material, and an SiO$_2$ mask as a substitute for a resist mask.

Another problem due to carbon is promotion of after-corrosion in etching an aluminum (Al) based material layer.

Generally, an Al based material layer is etched by using chlorine based gases, typically, BCl$_3$/Cl$_2$ mixed gas. After completion of etching, an etching reaction product AlCl$_3$, etching gas decomposition products, etc. will inevitably remain on the surface of the wafer carrying the Al based material layer. These residues will not only adsorb on the surface of the wafer but also occlude on the inside of the resist mask and carbonaceous polymer acting as a sidewall protection film. The resulting residual chlorine will absorb water in the air to form an electrolytic droplet, in which aluminum from the Al based material layer will be eluted to promote corrosion. The recent trend in etching the Al based material layer has been toward fabricating a barrier metal or anti-reflection film therewith and adding copper (Cu) thereto to prevent electro-migration. However, these additives will serve to promote more after-corrosion than prevent the after-corrosion.

The present inventor has proposed a dry etching method whereby an Al based material layer is masked with an SiO$_2$ material layer containing spin on glass (SOG) and etched by using S$_2$Cl$_2$, S$_2$Br$_2$, and other sulfur halides while cooling a target wafer to temperatures below 0° C. In this method, the SiO$_2$ based material layer is substituted for a resist mask, reducing the quantity of residual chlorine. Further, the sulfur halides, when dissociated by electric discharges, will form free sulfur in a plasma for adsorption on the surface of a cooled wafer. The sulfur thus formed will replace the carbonaceous polymer in depositing on pattern sidewalls and providing sidewall protection effects, thus contributing to anisotropic etching.

Thus, various etching methods have been proposed wherein an SiO$_2$ based material layer is used as an etching mask to avoid various problems due to carbon. However, there are some problems in putting an SiO$_2$ mask to practical use in etching processes. First, in a gate electrode forming process using an SiO$_2$ mask, since a formed gate electrode is eventually coated with an inter-layer insulation film, the SiO$_2$ mask may be left unremoved without hindering production of a semiconductor device.

Nevertheless, it is preferred to remove the SiO$_2$ mask in order to prevent an increase in the magnitude of wafer surface steps, which may deteriorate the accuracy of the step coverage photo-lithography for material layers formed in the subsequent processes or photo-lithography. However, any attempt to remove the SiO$_2$ mask through etching will remove a thin gate oxide film as well, making this process impractical.

Meanwhile, in an Al based material layer etching process using an SOG mask, although after-corrosion is prevented effectively, another process is required for forming an SOG mask. It is also preferred to prevent such an increase in the number of necessary processes.

OBJECT AND SUMMARY OF THE INVENTION

It is therefore an object of the present invention to provide a dry etching method whereby a nitrogen based compound film can be substituted for a resist mask without accompanying an increase in the magnitude of wafer surface steps and the number of necessary processes.

In a dry etching method according to the present invention, a nitrogen based compound film is used as an etching mask while a sulfur based compound is used as a main constituent of the etching gas.

The nitrogen based compound film can act as an etching mask because the sulfur based compound, when dissociated by electric discharges, will form free sulfur in a plasma for combination with nitrogen supplied from the nitrogen based compound film, on whose surface will be formed a sulfur nitride based compound film.

The mechanism whereby nitrogen is supplied from the nitrogen based compound film, for instance, an $Si_3N_4$ layer has already been discussed in "Semiconductor Plasma Process Technology" by Takuo Sugano, P.133–134 (published by Sangyo Tosho Co., Ltd.), 1980 National Convention Record, IEE Japan, Vol. 5, S 6-2 (published by the IEE), and other sources. According to these sources, $F^*$ and other radicals formed in a plasma will extract silicon atoms from the surface of the $Si_xN_y$ layer to form dangling nitrogen bonds, which will become ready to combine any other atom.

In a dry etching method according to the present invention, the dangling nitrogen bonds will combine with the free sulfur formed in a plasma to form various sulfur nitride based compounds, which will be removed through sputtering in competition with the forming process thereof, thus serving to greatly reduce etchrate and achieve high selectivity for the surface of the nitrogen based compound film. Thus, the nitrogen based compound film, whose application as an etching mask has been unknown, can act as such. Almost the same holds true of any other nitrogen based compound film than the $Si_3N_4$ layer.

Most typical of the above-mentioned sulfur nitride based compounds is a polythiazyl represented by a general formula $(SN)_x$. The simplest process of forming a polythiazyl is that a dangling nitrogen bond will combine with sulfur to form thiazyl ($N\equiv S$), which has unpaid electrons analogous to those of an oxygen analog nitrogen oxide (NO) and polymerizes easily to form $(SN)_2$, $(SN)_4$, and $(SN)_x$. $(SN)_2$ polymerizes easily at temperatures around 20° C. to form $(SN)_4$ and $(SN)_x$, and decomposes at temperatures around 30° C. $(SN)_4$ is a cyclic compound with a melting point of 178° C. and a decomposition point of 206° C. $(SN)_x$ is a chemically stable compound which will not decompose at temperatures below 130° C. According to the present invention, a target wafer is maintained at temperatures below room temperature, so that $(SN)_x$ will remain stable on the wafer.

When $F^*$, $Cl^*$, $Br^*$, and other halogen radicals are also present besides sulfur and nitrogen in a plasma, the resulting halogen atoms may combine with the sulfur atoms of $(SN)_x$ to form thiazyl halide. Further, when hydrogen based gas is added to regulate the quantity of $F^*$ formed in a plasma, the resulting hydrogen may combine with the $(SN)_x$ to form thiazyl hydride.

Under some conditions, the above-mentioned sulfur nitride based compounds may be $S_4N_2$ (melting point: 23° C.), $S_{11}N_2$ (melting point: 150°–155° C.), $S_{15}N_2$ (melting point: 137° C.), $S_{16}N_2$ (melting point: 122° C.), and other cyclic sulfur nitride compounds containing much more sulfur atoms than nitrogen atoms, as well as $S_7NH$ (melting point: 113.5° C.), 1, 3-$S_6(NH)_2$ (melting point: 130° C.), 1, 4-$S_6(NH)_2$ (melting point: 133° C.), 1, 5-$S_6(NH)_2$ (melting point: 155° C.), 1, 3, 5-$S_5(NH)_3$ (melting point: 124° C.), 1, 3, 6-$S_5(NH)_3$ (melting point: 131° C.), $S_4(NH)_4$ (melting point: 145° C.), and other imido compounds composed of hydrogen atoms combined with nitrogen atoms of the above-mentioned cyclic sulfur nitride compounds.

The above-mentioned sulfur nitride based compounds containing sulfur and nitrogen will decompose for removal from a wafer immediately when the wafer is heated to temperatures above 130° C., so that they will not remain on the wafer or cause particle pollution.

Further, it is another object of the present invention to provide an etching method which can promote formation of such sulfur nitride based compounds.

One measure for accomplishing this object is to add a nitrogen based compound to the etching gas to form sulfur nitride based compounds in the gaseous phase besides the solid phase for deposition on the surface of a target wafer. Namely, when a sulfur based compound and a nitrogen based compound are dissociated by electric discharges, they will form sulfur and nitrogen respectively which will react with each other to form various sulfur nitride based compounds, typically $(SN)_x$, in a plasma. The sulfur nitride based compounds thus formed in the gaseous phase will work with those formed in the solid phase to protect the surface of a nitrogen based compound film.

Another measure is to add at least one radical halide consuming compound selected from $H_2$, $H_2S$, and silane based compounds to the etching gas in an attempt to increase the apparent S/X ratio (i.e. the ratio of the number of sulfur (S) atoms to that of halogen (X) atoms) of the etching system, create a relatively sulfur-rich atmosphere, and thereby promote formation of sulfur nitride based compounds.

Of the above-mentioned additives, $H_2$ and $H_2S$, which, when dissociated by electric discharges, will form $H^*$, which will capture excessive radical halogen ($X^*$) for removal from the etching system in the form of hydrogen halide (HX) via the exhaust system of the etcher, thus serving to increase the S/X ratio of the etching reaction system. $H_2S$ in particular, makes a great contribution to this effect because it supplies sulfur for itself.

Meanwhile, silane based compounds, when dissociated by electric discharges, will form $Si^*$ besides $H^*$. Both these radials will also capture $X^*$ for removal from the etching system in the form of HX or $SiX_n$, thus serving to increase the S/X ratio effectively.

According to the present invention, a nitrogen based compound film may almost always be formed for use as an etching mask without involving any additional processes. Typical of such a film are an anti-reflection film formed on the surface of a refractory metal silicide layer like $WSi_x$ layer, Al based material layer, etc. Having a high reflection index, these material layers are more likely to be affected by reflected light in recent years as design rules for semiconductor devices become more strict and pattern dimensions become closer to exposure wavelengths in photolithography. To avoid such an adverse effect, therefore, the anti-reflection film is used to prevent deformation of a resist pattern or occurrence of critical dimension losses. The common materials for the anti-reflection film are nitrogen based compounds, such as TiON, TiN, and $Si_3N_4$. According to the present invention, an etching mask formed of these nitrogen based compounds can be used without involving any additional processes.

Thus, a dry etching method according to the present invention is characterized in that a nitrogen based compound film, whose application as an etching mask has been unknown, can act as such when used in combination with etching gas containing a sulfur based compound. Therefore, according to the present invention, the nitrogen based compound film may be substituted for a resist mask to avoid various problems inherent thereto, such as deterioration of selectivity for an $SiO_2$ based material layer due to carbon, promotion of particle pollution due to carbonaceous polymers, and promotion of after-corrosion due to residual chlorine inside the carbonaceous polymer.

Further, according to the present invention, a nitrogen based compound film, usually about one tenth as thick as a target material layer, may be left unremoved as part of an inter-layer insulation film after used as an anti-reflection film without accompanying an excessive increase in the magnitude of wafer surface steps. When the present invention is applied to a barrier metal based Al metallization process, a nitrogen based compound film can be removed while etching a barrier metal, thus inhibiting after-corrosion without accompanying an increase in the magnitude of wafer surface steps.

As is clear from the foregoing description, the present invention is particularly useful for such industrial applications as production of high-performance, high-reliability, large-scale integrated semiconductor devices conforming to strict design rules.

BRIEF DESCRIPTION OF THE DRAWINGS

FIG. 1a shows a stage where a resist mask is formed on a TiON anti-reflection film. FIG. 1b shows a stage where a TiON anti-reflection film pattern is formed. FIG. 1c shows a stage where a W polycide film is etched. FIG. 1d shows a stage where $(SN)_x$ and S are removed from a wafer through decomposition or sublimation.

FIG. 2a shows a stage where a TiON anti-reflection film pattern is formed. FIG. 2b shows a stage where a $WSi_x$ layer is etched. FIG. 2c shows a stage where a polysilicon layer is etched. FIG. 2d shows a stage where $(SN)_x$ is removed from a wafer through decomposition or sublimation.

FIG. 3a shows a stage where a resist mask is formed on a TiON anti-reflection film. FIG. 3b shows a stage where a TiON anti-reflection film pattern is formed. FIG. 3c shows a stage where an Al-1% Si layer is ethced. FIG. 3d shows a stage where a TiON anti-reflection film pattern, barrier metal, S deposits, and $(SN)_n$ deposits are removed.

DETAILED DESCRIPTION OF THE INVENTION

The following paragraphs describe some preferred embodiments of the present invention.

EXAMPLE 1

In this example, a dry etching method according to the present invention is applied to a gate electrode forming process wherein a W polycide film masked by a TiON anti-reflection film pattern is etched by using $S_2F_2/H_2$ mixed gas. This process is described by referring to FIGS. 1a–1d.

Figure 1A:
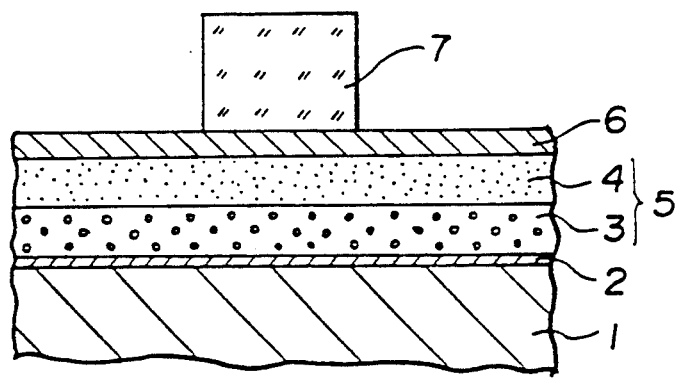
FIGS. 1a–1d are schematic sectional views showing the stages of a dry etching method applied in one preferred embodiment thereof to a gate electrode forming process.

Referring first to FIG. 1a, a silicon substrate 1 was coated on the surface thereof with a gate oxide film 2, which was formed in a thickness of about 8 nm by thermal oxidation. Then, the gate oxide film 2 was coated on the surface thereof with a W polycide film 5 for forming a gate electrode. The W polycide film 5 was composed of a polysilicon layer S doped with n-type impurities (about 100 nm thick) and a $WSi_x$ layer 4 (about 100 nm thick), which were fabricated in this order on the gate oxide film 2. Further, the W polycide film 5 was coated on the surface thereof with a TiON anti-reflection film 6, which was formed in a thickness of 40 nm by reactive sputtering. Finally, the TiON anti-reflection film 6 was provided on the surface thereof with a resist mask 7, which was formed of a chemical amplification photoresist material in a thickness of 0.35 um by patterning. The resist mask 7 was patterned by KrF excimer laser lithography and alkaline development into a highly anisotropic shape because the TiON anti-reflection film 6 served to reduce the adverse effect on the resist mask 7 by reflected light from the underlying $WSi_x$ layer 4.

The sample wafer thus formed was set on a wafer supporting electrode provided on a magnetron type reactive ion etcher (RIE). In this state, the TiON anti-reflection film 6 was etched, for instance, under the following conditions:

| | |
|---|---|
| c-$C_4F_8$ flow rate: | 50 SCCM |
| $O_2$ flow rate: | 5 SCCM |
| Gas pressure: | 1.3 Pa (10 mTorr) |
| RF power density: | 3.1 W/cm² (2 MHz) |

In the above-mentioned etching conditions, c-$C_4F_8$ (octafluorocyclobutane) will form from each molecule thereof a plurality of $CF_x^+$ ions which will assist an etching reaction. Besides, c-$C_4F_8$ will supply carbon for itself due to the carbon skeleton thereof without being supplied with depositional gas as additive gas and serve to sufficiently increase the C/F ratio (i.e. the ratio of carbon (C) atoms to that of fluorine (F) atoms) of the etching system, thus improving both selectivity and anisotropy. The TiON anti-reflection film 6 was selectively removed in the form of $TiO_xF_y$, etc.

Figure 1B:
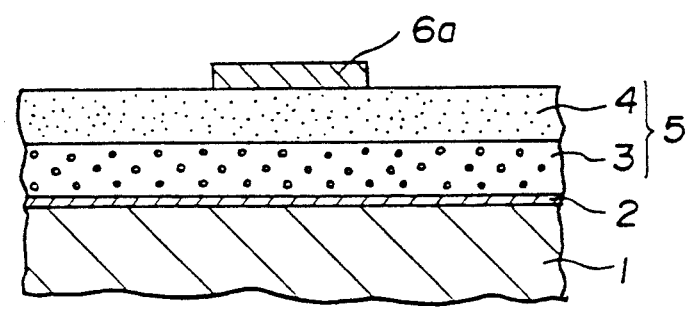
Figure 1C:
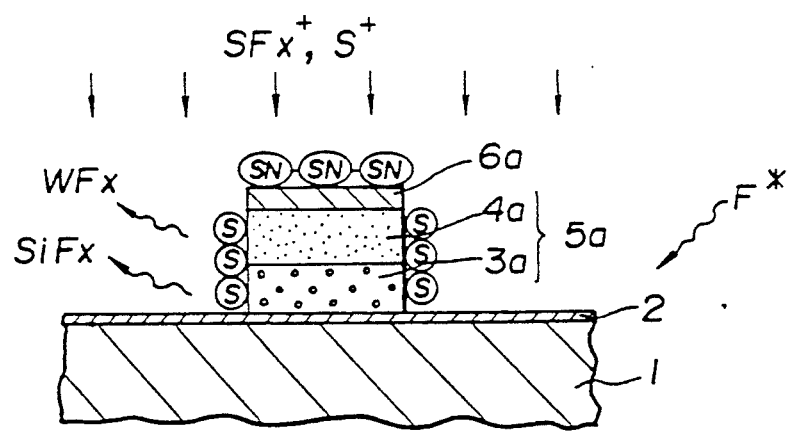

Referring next to FIG. 1b, when the sample wafer was set on a plasma ashing apparatus to remove the resist mask 7 by ordinary $O_2$ plasma ashing, a TiON anti-reflection film pattern 6a was formed on the wafer. This means that the TiON anti-reflection film 6, which no longer acted as an anti-reflection film, was patterned to form an etching mask.

Then, the wafer was set on a wafer supporting electrode provided on an RF biased magnetically enhanced microwave plasma etcher to etch the W polycide film 5. The wafer supporting electrode houses a cooling pipe for circulating a refrigerant, i.e. ethanol in the Example 1, fed from a cooling system, for instance, a chiller to cool the wafer to predetermined temperature. In this state, the W polycide film 5 was etched, for instance, under the following conditions:

| | |
|---|---|
| $S_2F_2$ flow rate: | 20 SCCM |
| $H_2$ flow rate: | 5 SCCM |
| Gas pressure: | 1.3 Pa (10 mTorr) |
| Microwave power: | 850 W (2.45 GHz) |
| RF bias power: | 5 W (400 kHz) |
| Wafer temperature: | −50° C. |

In the above-mentioned etching conditions, $S_2F_2$ is one of sulfur fluorides proposed by the present inventors as effective chlorofluorocarbon (CFC)-free etching gas for a silicon based material layer in the Proceedings on the 4th MicroProcess Conference (1991), p. 32. $S_2F_2$ formed F*, which acted as a main etchant for the silicon based material layer and promoted etching with the assistance of such ions as $SF_x^+$ and $S^+$. $H_2$ contained in etching gas formed H* in a plasma, which captured excessive F* for removal from the etching system in the form of HF, thus serving to increase the S/F ratio (i.e. the ratio of the number of sulfur (S) atoms to that of fluorine (F) atoms) of the etching system. On the W polycide film 5, the lower polysilicon layer 3 was more vulnerable to attacks by F* than the upper $WSi_x$ layer 4 and was prevented from under-cutting by increasing the S/F ratio and thereby reducing the amount of F* in the above-mentioned manner.

Another advantage of capturing excessive F* was to improve selectivity for the underlying gate oxide film 2. In the above-mentioned etching conditions, the low wafer temperature inhibited the reactivity of F* and the low RF bias power reduced the energy of incident ions, thus further improving selectivity for the gate oxide film 2.

Another important feature of $S_2F_2$ is that it has a higher S/F ratio than the most well-known sulfur fluoride $SF_6$ and will form free sulfur in a plasma. The sulfur thus formed in a plasma will adsorb on the surface of a target substrate (wafer) when it is kept at temperatures below room temperature.

At this time, sulfur nitride based compounds were formed on the surface of the TiON anti-reflection film pattern 6a. The estimated process of forming the sulfur nitride based compounds is that F* present in a plasma extracts Ti atoms in the form of $TiO_xF_y$ to form dangling nitrogen bonds, which combine with sulfur also present in a plasma. Typical of the sulfur nitride based compounds is a polythiazyl $(SN)_x$, which is shown schematically in FIG. 1c. The sulfur nitride based compounds served to greatly reduce an etchrate on the surface of the TiON anti-reflection film pattern 6a. This is the reason why the TiON anti-reflection film pattern 6a acted adequately as an etching mask.

Meanwhile sulfur which is present in a plasma is deposited on the sidewalls to protect the sidewalls of the TiON anti-reflection film pattern 6a, which were struck by no ion in principle.

As a result, a gate electrode 5a was formed into a highly anisotropic shape. Incidentally, individual material layer patterns formed after etching are identified by a subscript "a" added to the numerals for corresponding material layers.

Figure 1D:
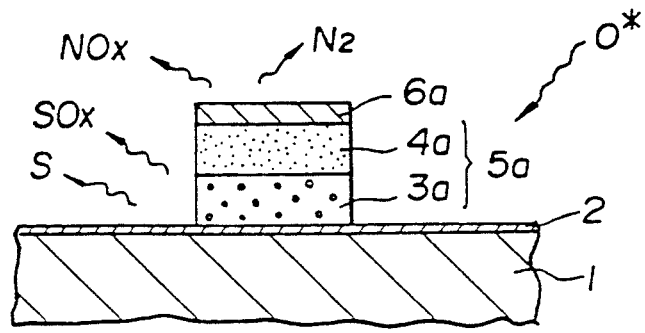

Referring finally to FIG. 1d, when the sample wafer was set on a plasma ashing apparatus to subject it to ordinary $O_2$ plasma ashing, the sulfur nitride based compounds deposited on the surface of the TiON anti-reflection film pattern 6a were removed in the forms of $NO_x$, $N_2$, $SO_x$, etc. while the sulfur deposited on the sidewalls thereof sublimed or was removed in the form of $SO_x$. As a result, no particle pollution occurred.

Incidentally, most sulfur nitride based compounds will decompose at temperatures above 130° C. while sulfur will sublime at temperatures above 90° C. Therefore, the wafer may be heated, for instance, to about 150° C. instead of subjecting it to $O_2$ plasma ashing.

According to the present invention, a nitrogen based compound film is substituted for a resist mask in forming a gate electrode, thereby avoiding various problems with the prior art, such as promotion of particle pollution due to carbonaceous polymers and deterioration of selectivity for an underlying gate oxide film. Further, sulfur formed in the gaseous phase is used to protect pattern sidewalls, thus eliminating the need for high-energy incident ions and improving selectivity for the gate oxide film.

The TiON anti-reflection film pattern 6a, about one fifth as thick as the gate electrode 5a, may be left unremoved as part of an inter-layer insulation film after being used as an etching mask without an accompanying excessive increase in the magnitude of the wafer surface steps.

In this Example, a TiON anti-reflection film acts as a nitrogen based compound film. It is to be understood, however, that any other anti-reflection film, for instance, an $Si_3N_4$ film formed through plasma CVD, may also be used as an etching mask to form a gate electrode.

EXAMPLE 2

In this Example, a dry etching methods according to the present invention is also applied to a gate electrode forming process wherein a W polycide film masked by a TiON anti-reflection film pattern is etched by using a $S_2F_2/H_2S$ gas mixture.

A sample wafer was prepared in the same manner as in Example 1 and provided on the surface thereof with the TiON anti-reflection film pattern 6a.

The sample wafer thus formed was set on a wafer supporting electrode provided on an RF biased magnetically enhanced microwave plasma etcher to etch the W polycide film 5, for instance, under the following conditions:

| | |
|---|---|
| $S_2F_2$ flow rate: | 20 SCCM |
| $H_2S$ flow rate: | 5 SCCM |
| Gas pressure: | 1.3 Pa (10 mTorr) |
| Microwave power: | 850 W (2.45 GHz) |
| RF bias power: | 5 W (400 kHz) |
| Wafer temperature: | −30° C. |

In the above-mentioned etching conditions, $H_2S$ added to the etching gas will supply both H* and S for itself, thus serving to increase the S/F ratio of the etching system more than the $H_2$, which was used in Example 1. In fact, even when the wafer was kept at 20° C. higher than in the first embodiment, sulfur nitride based compounds, typically $(SN)_x$, and sulfur based sidewall protection films were formed, so that a gate electrode was formed into a highly anisotropic shape with high selectivity for the TiON anti-reflection film pattern 6a.

EXAMPLE 3

In this Example, a dry etching methods according to the present invention is applied to a gate electrode forming process wherein a W polycide film masked by a TiON anti-reflection film is etched in two steps. Namely a $WSi_x$ is first etched by using a $S_2F_2/N_2$ gas mixture and a polysilicon layer is then etched by using a $S_2Br_2/N_2$ gas mixture. This process is described by referring to FIGS. 2a–2d with the same reference symbols as FIGS. 1a–1d.

Figure 2A:
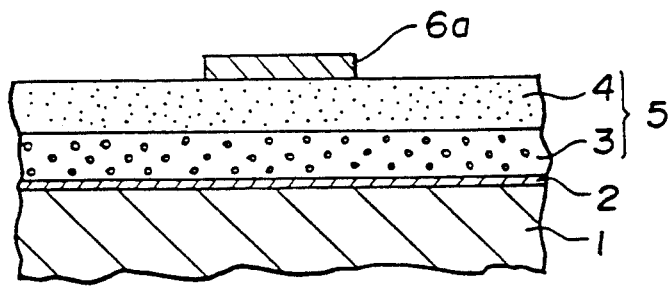
FIGS. 2a–2d are schematic sectional views showing the stages of a dry etching method applied in another preferred embodiment thereof to a gate electrode forming process.

Referring first to FIG. 2a, a sample wafer was prepared in the same manner as in Example 1 and provided on the surface thereof with the TiON anti-reflection film pattern 6a.

The sample wafer thus formed was set on a wafer supporting electrode provided on an RF biased magnetically enhanced microwave plasma etcher to first etch the $WSi_x$ layer 4, for instance, under the following conditions:

| | |
|---|---|
| $S_2F_2$ flow rate: | 10 SCCM |
| $N_2$ flow rate: | 10 SCCM |
| Gas pressure: | 1.3 Pa (10 mTorr) |
| Microwave power: | 850 W (2.45 GHz) |
| RF bias power: | 5 W (400 kHz) |
| Wafer temperature: | −20° C. |

Figure 2B:
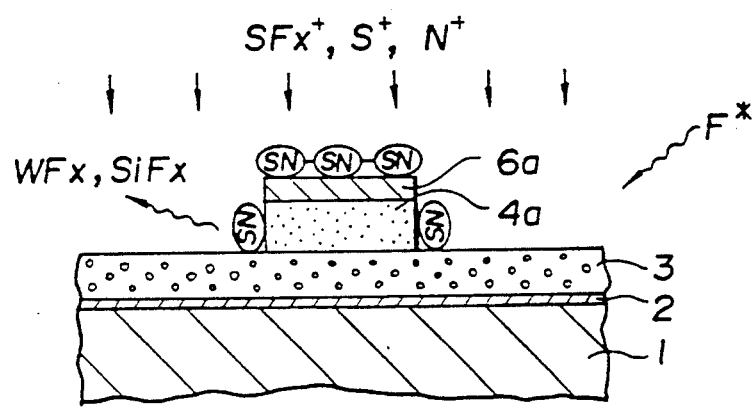

Then, sulfur nitride based compounds deposited on the surface of the TiON anti-reflection film pattern 6a in the same manner as in Example 1. In the above-mentioned etching conditions, since $N_2$ was added to the etching gas, sulfur nitride based compounds were also formed in a plasma for deposition on the sidewalls of the TiON anti-reflection film pattern 6a, which were struck by no incident ion in principle, on the surface of the sample wafer kept at −20° C. These sulfur nitride based compounds protected the sidewalls of the TiON anti-reflection film pattern 6a. As a result, the $WSi_x$ pattern 4a was formed into a highly anisotropic shape as shown in FIG. 2b.

Next, the polysilicon layer 3 was etched, for instance, under the following condition:

| | |
|---|---|
| $S_2Br_2$ flow rate: | 10 SCCM |
| $N_2$ flow rate: | 10 SCCM |
| Gas pressure: | 1.3 Pa (10 mTorr) |
| Microwave power: | 850 W (2.45 GHz) |
| RF bias power: | 15 W (400 kHz) |
| Wafer temperature: | −20° C. |

Figure 2C:
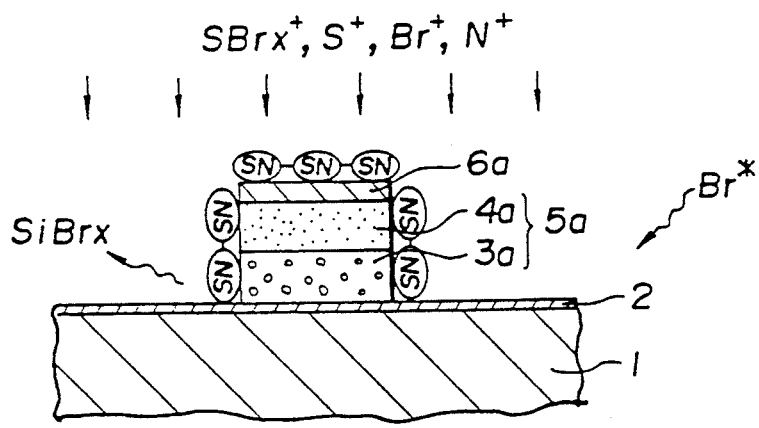

In the above-mentioned etching conditions, $S_2Br_2$ was substituted for $S_2F_2$ in order to remove F* from the etching system and form Br* for use as a main etchant, thereby improving selectivity for the underlying gate oxide film 2. At this time, sulfur nitride based compounds also deposited on both the surface and sidewalls of the polysilicon layer 3. As a result, the gate electrode 5a was formed into a highly anisotropic shape as shown in FIG. 2c.

Figure 2D:
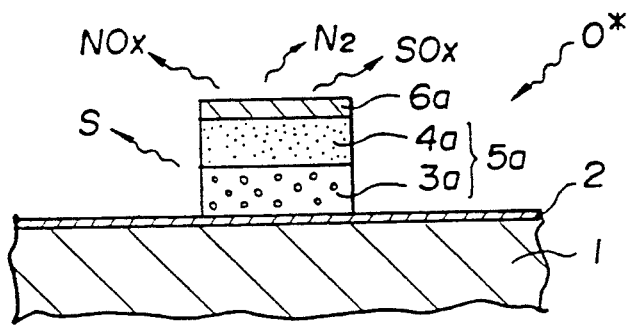

Referring finally to FIG. 2d, when the sample wafer was set on a plasma ashing apparatus to subject it to ordinary $O_2$ plasma ashing, the sulfur nitride based compounds deposited on the surface of the sample wafer were removed in the form of $NO_x$, $N_2$, $SO_x$, etc. As a result, no particle pollution occurred.

EXAMPLE 4

In this Example, a dry etching methods according to the present invention is also applied to a gate electrode forming process wherein a W polycide film masked by a TiON anti-reflection film pattern is etched by using a $S_2F_2/N_2/H_2$ gas mixture.

A sample wafer was prepared as shown in FIG. 2a and set on a wafer supporting electrode provided on an RF biased magnetically enhanced microwave plasma etcher to etch the W polycide film 5, for instance, under the following conditions:

| | |
|---|---|
| $S_2F_2$ flow rate: | 20 SCCM |
| $N_2$ flow rate: | 10 SCCM |
| $H_2$ flow rate: | 10 SCCM |
| Gas pressure: | 1.3 Pa (10 mTorr) |
| Microwave power: | 850 W (2.45 GHz) |
| RF bias power: | 5 W (400 kHz) |
| Wafer temperature: | 0° C. |

In the above-mentioned etching conditions, $H_2$ added to the etching gas served to increase the apparent S/F ratio of the etching system. As a result, the gate electrode 5a was formed into a highly anisotropic shape as shown in FIG. 2c without the need to etch the W polycide film 5 in two steps as in Example 3.

EXAMPLE 5

In this Example, a dry etching method according to the present invention is applied to a barrier metal based Al metallization process wherein an Al-1% Si layer masked by a TiON anti-reflection film is etched by using $S_2Cl_2$ and a barrier metal is then etched by using a $NF_3/O_2$ gas mixture. This process is described by referring to FIGS. 3a–3d.

Figure 3A:
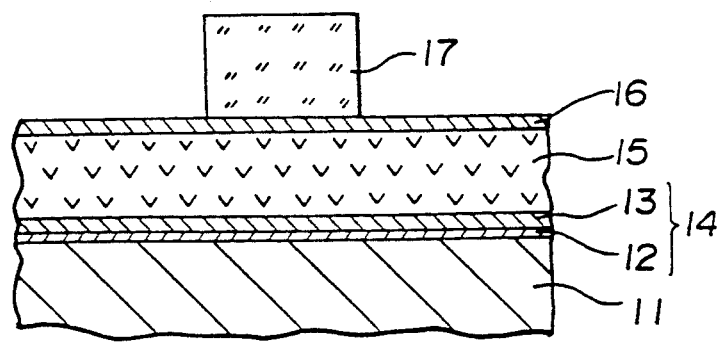
FIGS. 3a–3d are schematic sectional views showing the stages of a dry etching method applied in one preferred embodiment to a barrier metal based Al metallization process.

Referring first to FIG. 3a, a silicon substrate 11 was provided on the surface thereof with a barrier metal 14 (100 nm thick), an Al-1% Si layer 15 (400 nm thick), and a TiON anti-reflection film 16 (40 nm thick), which were formed in this order by sputtering. The barrier metal 14 was composed of a Ti layer 12 (30 nm thick) and a TiON layer 13 (70 nm thick), which were fabricated in this order on the silicon substrate 11. Further, the TiON anti-reflection film 16 was provided on the surface thereof with a resist mask 17, which was formed of a chemical amplification photoresist material by patterning.

The sample wafer thus formed was set on a wafer supporting electrode provided on a hexode type reactive ion etcher. In this state, the TiON anti-reflection film 16 was etched via the resist mask 17, for instance, under the following conditions:

| | |
|---|---|
| c-$C_4F_8$ flow rate: | 70 SCCM |
| $O_2$ flow rate: | 10 SCCM |
| Gas pressure: | 6.7 Pa (50 mTorr) |
| RF power density: | 4.2 W/cm$^2$ (2 MHz) |

Figure 3B:
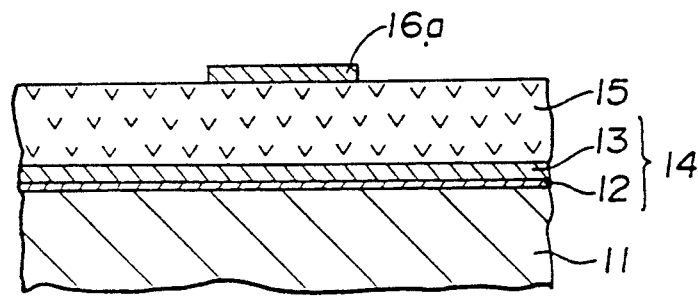
Figure 3C:
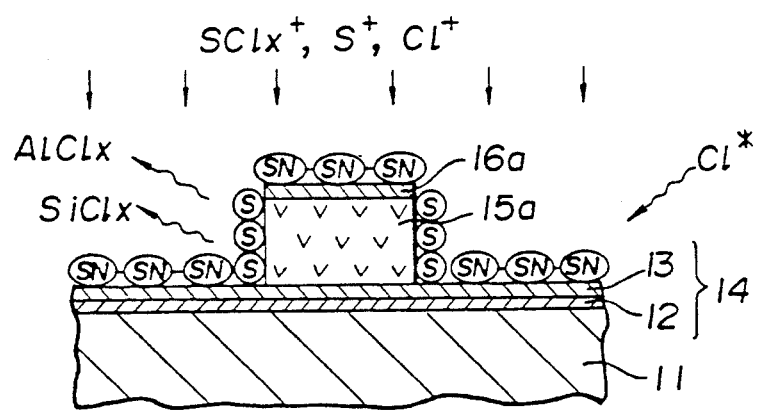

Referring next to FIG. 3b, when the sample wafer was set on a plasma ashing apparatus to remove the resist mask 7 by ordinary $O_2$ plasma ashing, a TiON anti-reflection film pattern 16a was formed on the wafer.

Then, the sample wafer was set on a wafer supporting electrode provided on an RF biased magnetically enhanced microwave plasma etcher. In this state, the Al-1% Si layer 15 was etched, for instance, under the following conditions:

| | |
|---|---|
| $S_2Cl_2$ flow rate: | 20 SCCM |
| Gas pressure: | 1.3 Pa (10 mTorr) |
| Microwave power: | 850 W (2.45 GHz) |
| RF bias power: | 50 W (2 MHz) |

| | |
|---|---|
| -continued | |
| Wafer temperature: | −30° C. |

In the above-mentioned etching conditions, $S_2Cl_2$ is one of the sulfur halides proposed by the present inventors as an etching gas for a silicon based material layer and an aluminum based material layer. $S_2Cl_2$ will form Cl*, which will act as a main etchant for the aluminum based material layer and promote etching with the assistance of such ions as $SCl_x^+$, $S^+$, and $Cl^+$.

Like the above-mentioned $S_2F_2$, $S_2Cl_2$, when dissociated by electric discharges, formed in a plasma free sulfur, which, in turn, formed sulfur nitride based compounds on the surface of the TiON anti-reflection film pattern 1ea. A polythiazyl $(SN)_x$ typical of the sulfur nitride based compounds is shown schematically in FIG. 3c. Sulfur is deposited on the sidewalls to protect the sidewalls of the TiON anti-reflection film pattern 16a in the same manner as in Example 1.

When the Al-1% Si layer 15 was almost etched, the underlying TiON layer 13 was exposed to a plasma, whereupon the sulfur nitride based compounds, typically $(SN)_x$, were formed on the surface of the TiON layer 13 in the above-mentioned manner, thus greatly reducing an etchrate on that surface. As a result, an Al based metallization pattern 15a was formed into a highly anisotropic shape with a selectivity of about 30 for the TiON layer 13.

Again, the sample wafer was set on a wafer supporting electrode provided on an RF biased magnetically enhanced microwave plasma etcher. In this state, the TiON anti-reflection film pattern 16a and the barrier metal 14 were etched, for instance, under the following conditions:

| | |
|---|---|
| $NF_3$ flow rate: | 50 SCCM |
| $O_2$ flow rate: | 5 SCCM |
| Gas pressure: | 1.3 Pa (10 mTorr) |
| Microwave power: | 850 W (2.45 GHz) |
| RF bias power: | 100 W (2 MHz) |
| Wafer temperature: | −30° C. |

Figure 3D:
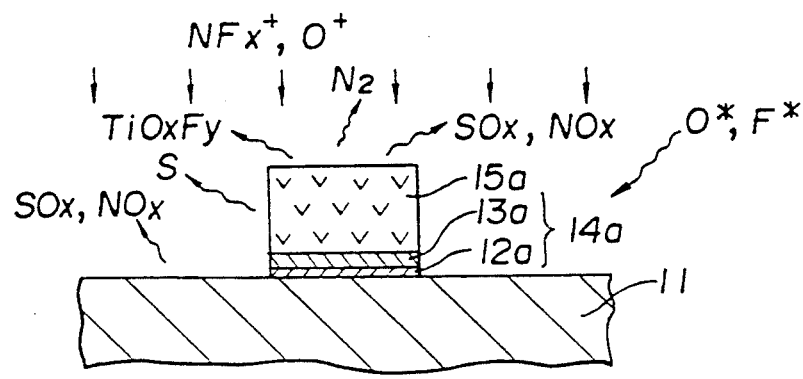

Referring finally to FIG. 3d, the TiON anti-reflection film pattern 16a volatilized for removal in the form of $TiO_xF_y$, etc. Further, the sulfur nitride compounds, typically $(SN)_x$, deposited on the surface of the TiON anti-reflection film pattern 16a and the TiON layer 13 were also removed in the form of $NO_x$, $N_2$, $SO_x$, etc. while the sulfur deposited on the sidewalls of the TiON anti-reflection film pattern 16a sublimed or was removed in the form of $SO_x$. As a result, no particle pollution occurred.

The wafer thus processed was left in the atmosphere experimentally for 72 hours but developed no after-corrosion in striking contrast to the conventional dry etching methods using a resist mask whereby the same sample wafer developed after-corrosion immediately after being left in the atmosphere. According to the prior art, a great quantity of chlorine will occlude in a resist mask and a sidewall protection film formed of the decomposition product thereof. By contrast, according to the present invention, neither an etching mask nor a sidewall protection film will entrap any residual chlorine.

Another advantage of the present invention is the ability to remove the TiON anti-reflection film pattern 16a in etching the barrier metal 14, thereby decreasing the number of interfaces between dissimilar material layers where chlorine is most likely to remain particularly when the Al based wire pattern 15a is composed of multiple layers.

EXAMPLE 6

Figure 4:
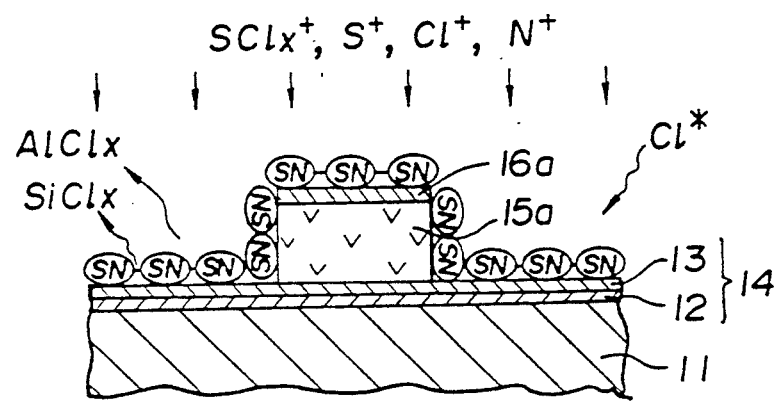
FIG. 4 is a schematic sectional view showing a stage of a dry etching method applied in another preferred embodiment to a barrier metal based Al metallization process where an Al-1% Si layer is etched.

In this Example, a dry etching method according to the present invention is applied to a barrier metal based Al metallization process wherein an Al-1% Si layer masked by a TiON anti-reflection film is etched by using a $S_2Cl_2/N_2$ gas mixture. This process is described by referring to FIG. 3b and FIG. 4.

Referring first to FIG. 3b, a sample wafer was prepared in the same manner as in Example 5 and provided on the surface thereof with the TiON anti-reflection film pattern 16a.

The sample wafer thus formed was set on a wafer supporting electrode provided on an RF biased magnetically enhanced microwave plasma etcher to etch the Al-1% Si layer 15, for instance, under the following conditions:

| | |
|---|---|
| $S_2F_2$ flow rate: | 20 SCCM |
| $N_2$ flow rate: | 10 SCCM |
| Gas pressure: | 1.3 Pa (10 mTorr) |
| Microwave power: | 850 W (2.45 GHz) |
| RF bias power: | 10 W (400 kHz) |
| Wafer temperature: | 20° C. |

Then, the Al-1% Si layer 15 was etched in the almost same manner as in Example 5, except that $N^+$ and other ions assisted the etching reaction. Further, since sulfur nitride based compounds were formed in the gaseous phase besides the solid phase, the Al-1% Si layer 15 was etched with a higher selectivity of about 40 for the TiON anti-reflection film pattern 16a and the underlying TiON layer 13. Moreover, sulfur nitride based compounds also deposited on the sidewalls of the TiON anti-reflection film pattern 16a, thus protecting them more effectively. As a result, the Al based metallization pattern 15a was formed into a highly anisotropic shape despite a smaller RF bias power and higher wafer temperature.

While the present invention has been described in six preferred embodiments thereof, it is to be understood that the present invention is not limited to those embodiments and that various changes and modifications may be made in the present invention without departing from the spirit and scope thereof.

For instance, in preferred embodiments of the present invention, a target material layer is a W polycide film or an Al-1% Si layer but may be replaced by a polycide film having a lower amorphous silicon layer, a polycide film containing other refractory metal than W, any other Al based material layer like an Al-1% Si-0.5% Cu layer, a single-crystal silicon layer, an amorphous silicon layer, a polysilicon layer, a refractory metal layer, etc. However, when a nitrogen based compound film is an anti-reflection film, the lower target material layer thereof should naturally have a relatively high reflection index.

Meanwhile, in preferred embodiments of the present invention, $S_2F_2$ forms free sulfur in a plasma when dissociated by electric discharges. But such sulfur based compounds may vary depending on the type of a target material layer. As one instance, when the target material layer is a silicon based compound layer, $S_2F_2$ may be replaced by sulfur fluorides such as $SF_2$, $SF_4$, $S_2F_{10}$, sulfur chlorides such as $S_3Cl_2$, $S_2Cl_2$, and $SCl_2$, sulfur bromides such as $S_3Br_2$, $S_2Br_2$, and $SBr_2$, thionyl fluoride ($SOF_2$), thionyl chloride ($SOCl_2$), thionyl bromide ($SOBr_2$), and other sulfur based compounds. As another instance, when the target material layer is an aluminum based compound layer, the above-mentioned group of compounds excluding those containing fluorine atoms are available.

Further, in preferred embodiments of the present invention, $H_2$ or $H_2S$ serves to increase the S/X ratio of the etching system. Basically, however, the effects of these halogen radical consuming compounds can also be achieved by silane based compounds like $SiH_4$.

Still further, $N_2$ contained as an additive gas in the etching gas may be replaced by $N_2H_2$, $NF_3$, $NCl_3$, $NBr_3$, nitrogen oxide, etc. It is to be noted, however, that $NH_3$ is not preferable as such an additive gas because it may react with sulfur to form ammonium sulfide in a solid state.

Etching gas may also contain He, Ar, and other rare gases for producing sputtering, cooling, and dilution effects.

What is claimed is:

1. A dry etching method comprising patterning a nitrogen based compound film into a shape to mask a lower target material layer selected from aluminum based materials and silicon based materials, and plasma etching said lower target material layer by using an etching gas containing a sulfur based compound capable of forming free sulfur in a plasma when dissociated by electric discharges so that free sulfur and sulfur nitrides are present during etching.

2. A dry etching method as claimed in claim 1 wherein said target material layer is any one of a polycide layer, aluminum based material layer, single-crystal silicon layer, polysilicon layer, amorphous silicon layer, and refractory metal layer.

3. A dry etching method as claimed in claim 1 wherein said nitrogen based compound film is composed of at least one compound selected from the group consisting TiON, TiN, and $Si_3N_4$.

4. A dry etching method as claimed in claim 1 wherein said sulfur based compound is at least one compound selected from the group consisting of from $S_2F_2$, $SF_2$, $SF_4$, $S_2F_{10}$, $S_3Cl_2$, $S_2Cl_2$, $SCl_2$, $S_3Br_2$, $S_2Br_2$, $SBr_2$, $SOF_2$, $SOCl_2$, and $SOBr_2$.

5. A dry etching method as claimed in claim 1 wherein said nitrogen based compound film is an anti-reflection film.

6. A dry etching method as claimed in claim 1 wherein said target material layer is a W polycide film formed on a single-crystal silicon substrate with an interposition of a gate oxide film and said nitrogen based compound film is a TiON anti-reflection film.

7. A dry etching method as claimed in claim 1 wherein said target material layer is an Al-1% Si layer formed on a single-crystal silicon substrate with an interposition of a barrier metal formed of a Ti layer and TiON layer which are fabricated in this order and said nitrogen based compound film is a TiON anti-reflection film.

8. A dry etching method comprising patterning a nitrogen based compound film into a shape to mask a lower target material layer selected from aluminum based materials and silicon based materials, and plasma etching said lower target material layer by using an etching gas containing a sulfur based compound capable of forming free sulfur in a plasma when dissociated by electric discharges and at least one halogen radical consuming compound selected from the group consisting of $H_2$, $H_2S$, and silane based compounds so that sulfur nitrides and free sulfur are formed during etching.

9. A dry etching method as claimed in claim 8 wherein said target material layer is any one of a polycide layer, aluminum based material layer, single-crystal silicon layer, polysilicon layer, amorphous silicon layer, and refractory metal layer.

10. A dry etching method as claimed in claim 8 wherein said nitrogen based compound film is composed of at least one compound selected from the group consisting of TiON, TiN, and $Si_3N_4$.

11. A dry etching method as claimed in claim 8 wherein said sulfur based compound is at least one compound selected from the group consisting of $S_2F_2$, $SF_2$, $SF_4$, $S_2F_{10}$, $S_3Cl_2$, $S_2Cl_2$, $SCl_2$, $S_3Br_2$, $S_2Br_2$, $SBr_2$, $SOF_2$, $SOCl_2$, and $SOBr_2$.

12. A dry etching method as claimed in claim 8 wherein said nitrogen based compound film is an anti-reflection film.

13. A dry etching method as claimed in claim 8 wherein said target material layer is a W polycide film formed on a single-crystal silicon substrate with an interposition of a gate oxide film and said nitrogen based compound film is a TiON anti-reflection film.

14. A dry etching method as claimed in claim 8 wherein said target material layer is an Al-1% Si layer formed on a single-crystal silicon substrate with an interposition of a barrier metal formed of a Ti layer and TiON layer which are fabricated in this order and said nitrogen based compound film is a TiON anti-reflection film.

15. A dry etching method comprising patterning a nitrogen based compound film into a shape to mask a lower target material layer selected from silicon based materials and aluminum based materials, and plasma etching said lower target material layer by using an etching gas containing a sulfur based compound capable of forming free sulfur in a plasma when dissociated by electric discharges, at least one halogen radical consuming compound selected from the group consisting of $H_2$, $H_2S$, and silane based compounds, and at least one nitrogen based compound selected from the group consisting of $N_2$, $N_2H_2$, $NF_3$, $NCl_3$, $NBr_3$, and nitrogen oxide so that both sulfur nitrides and free sulfur are produced during etching.

16. A dry etching method as claimed in claim 15 wherein said target material layer is any one of a polycide layer, aluminum based material layer, single-crystal silicon layer, polysilicon layer, amorphous silicon layer, and refractory metal layer.

17. A dry etching method as claimed in claim 15 wherein said nitrogen based compound film is composed of at least one compound selected from the group consisting of TiON, TiN, and $Si_3N_4$.

18. A dry etching method as claimed in claim 15 wherein said sulfur based compound is at least one compound selected from the group consisting of $S_2F_2$, $SF_2$, $SF_4$, $S_2F_{10}$, $S_3Cl_2$, $S_2Cl_2$, $SCl_2$, $S_3Br_2$, $S_2Br_2$, $SBr_2$, $SOF_2$, $SOCl_2$, and $SOBr_2$.

19. A dry etching method as claimed in claim 15 wherein said nitrogen based compound film is an anti-reflection film.

20. A dry etching method as claimed in claim 15 where in said target material layer is a W polycide film formed on a single-crystal silicon substrate with an interposition of a gate oxide film and said nitrogen based compound film is a TiON anti-reflection film.

21. A dry etching method as claimed in claim 15 wherein said target material layer is an Al-1% Si layer formed on a single-crystal silicon substrate with an interposition of a barrier metal formed of a Ti layer and TiON layer which are fabricated in this order and said nitrogen based compound film is a TiON anti-reflection film.

* * * * *